(12) United States Patent  (10) Patent No.: US 7,557,578 B1
Zens et al.  (45) Date of Patent: Jul. 7, 2009

(54) LOW LOSS NMR SAMPLE HOLDER

(75) Inventors: Albert P. Zens, Salinas, CA (US); Jason William Cosman, Livermore, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 12/202,023

(22) Filed: Aug. 29, 2008

(51) Int. Cl.
*G01V 3/00* (2006.01)

(52) U.S. Cl. ........................ 324/321; 324/318
(58) Field of Classification Search ......... 324/300–322; 422/102, 67; 436/173
See application file for complete search history.

(56) References Cited

U.S. PATENT DOCUMENTS

| | | | | |
|---|---|---|---|---|
| 5,397,989 A | * | 3/1995 | Spraul et al. | 324/321 |
| 5,517,856 A | * | 5/1996 | Hofmann et al. | 324/321 |
| 5,552,709 A | | 9/1996 | Anderson | |
| 6,593,743 B2 | * | 7/2003 | de Swiet et al. | 324/318 |
| 6,768,305 B1 | * | 7/2004 | Keifer | 324/321 |
| 6,774,634 B2 | * | 8/2004 | Cosman | 324/321 |
| 6,917,201 B2 | | 7/2005 | de Swiet | |
| 7,068,034 B2 | | 6/2006 | de Swiet | |
| 7,088,101 B2 | * | 8/2006 | Mett et al. | 324/321 |
| 7,119,542 B1 | * | 10/2006 | Howard et al. | 324/321 |
| 2003/0080740 A1 | * | 5/2003 | de Swiet et al. | 324/318 |
| 2004/0108852 A1 | * | 6/2004 | de Swiet | 324/321 |
| 2005/0077900 A1 | * | 4/2005 | de Swiet | 324/321 |

* cited by examiner

*Primary Examiner*—Brij B Shrivastav
(74) *Attorney, Agent, or Firm*—Bella Fishman; Edward H. Berkowitz

(57) ABSTRACT

An elongate sample volume matching an elongate region of uniform RF magnetic field established by a saddle coil, is approximated by at least one pair of cylindrical sample tubes in parallel orientation with the geometric axis of the saddle coil. The displacement of the two cylindrical tubes defines a direction transverse to the tube axes and this transverse direction is aligned parallel with the RF magnetic field of the saddle coil.

10 Claims, 5 Drawing Sheets

US 7,557,578 B1

LOW LOSS NMR SAMPLE HOLDER

FIELD OF THE INVENTION

This work is in the field of nuclear magnetic resonance analysis and particularly relates to sample cells for such analysis.

BACKGROUND OF THE INVENTION

Magnetic resonance phenomena occurs in a magnetic environment that is controllably homogeneous: uniform in magnitude, direction and stable in time. This environment is known as the polarizing field and imparts to the chaotically directed nuclear spins, a preferred direction in space around which the variously directed nuclear spins precess. Much effort has been directed to the production and control of the polarizing field.

The resonant absorption of energy from an external source occurs through the agency of an RF magnetic field applied to the nuclei under study at an angle (preferably 90° to the polarizing field) through an RF resonator. Substantial effort has been expended to produce and control the homogeneity of this RF magnetic field associated with this resonator as experienced by and with the nuclei of the sample under study. The shape, material and motion of the vessel containing the (liquid) sample has been studied and taken as a subject for further advancement of the homogeneity of the environment of the sample. The present work concerns this latter area of sample shape for further innovation.

The RF resonator has been a fertile ground for development over many decades. The present work is intended for the case where the RF magnetic field associated with the resonator is in the plane normal to the polarizing field. The form of resonator for this arrangement is known as a saddle shaped coil and the present work is limited to operation with such saddle coils. It should be recognized herein that the role of the RF resonator is understood to encompass provision for signals corresponding to either or both excitation and de-excitation of the nuclei under study.

In conventional practice, liquid samples for investigation via NMR are presented in long cylindrical tubes along the axis of the RF saddle coil of the NMR probe. When the RF coil is saddle shaped, the direction of the RF magnetic field (within the volume defined by the coil) is transverse to the long axis of the cylindrical sample vessel. FIG. 1a shows a schematic representation of the coil elements, the sample vessel and RF magnetic field in cross section for a conventional arrangement. This figure also shows the common arrangement of separate coaxially disposed coils. As shown, these coils produce respective RF fields on orthogonal directions in the plane transverse to their common axis.

An improvement to this conventional arrangement appears when the filling factor of the coil (the volume of the sample in respect of the interior volume defined by the coil) is optimized through allowing the inner dimensions of the RF coil to more closely approach the outer dimensions of the sample vessel. Moreover prior art recognized that the RF magnetic flux is substantially homogeneous within the inner confines of the RF coil and would be even more so were the cross section of the RF saddle coil to be deformed from conventional quasi-arc sectors (in cross section) of FIG. 1a, to planar segments and the sample vessel cross section similarly deformed to an elongate cross sectional shape (ellipsoidal or rectangular) in conformity with an elongate (ellipsoidal or rectangular) coil cross section. This geometry is intended to produce a greater degree of homogeneity in the RF magnetic field of the saddle coil and to yield an extended volume space wherein such homogeneity obtains. Such prior art is illustrated in FIGS. 1b and 1c and more description appears in the U.S. Pat. Nos. 7,068,034 and 6,917,201, both assigned to Varian, Inc.

Lossy samples present a case of particular concern. Such samples exhibit a significant electrical conductivity and under the influence of RF electric fields there results RF currents, which contribute noise (for example, from the magnetic fields associated with these currents) and thus degrade the sensitivity of the NMR instrument. The geometrical region of a sample producing the greatest contribution to signal is that region of the highest RF magnetic field amplitude, which may be identified with a region proximate the saddle coil axis. As the sample cross section is increased, more sample may be included, but the influence of the RF E field will be more effective in producing noise in that portion of the space more remote from the central region. The signal to noise figure therefore suffers. For study of lossy samples, it has been common practice to present the sample in a 3 mm sample tube to minimize the effect of RF electric fields by confining the sample to close proximity to the RF coil axis. In such arrangements, sensitivity is inherently compromised by the dearth of sample volume.

The prior art sample vessel of rectangular cross section is difficult to manufacture to the uniform close tolerances necessary for application to high field/high resolution NMR analysis. By way of comparison, conventional cylindrical sample vessels of 3 mm O.D. are commercially offered with a concentricity specification of 0.0005 and a camber specification of 0.00025 over axial lengths of 8 inches (203.2 mm). To approach equivalent tolerances rectangular cross section vessels must be selected from a great number of units at considerable expense. Indeed, the specification of outer dimension and wall thickness for cylindrical tubes is more easily achieved than the specification of two outer dimensions and inner area for the prismatic tube. Accordingly, it is desired to obtain the benefit of the matching a transversely elongate sensitive volume (associated with a saddle coil) to an elongate sample volume in a reliably reproducible and inexpensive manner.

In another prior art sample cell (U.S. Pat. No. 5,552,709, assigned to Varian, Inc.), the same sample for analysis fills a plurality of separate sample holding structures for analysis. The multiple cells are intended to reduce the electrical current paths through lossy sample solutions. The array of closely packed sample vessels is uniform in cross sectional distribution and provides no benefit from alignment of the shape of a macro-sample in respect of the RF magnetic field.

SUMMARY OF THE INVENTION

An elongate cross section for a sample vessel, for use with a correspondingly elongate sensitive volume for NMR measurement, is achieved by parallel disposition of at least two (conventional) cylindrical vessels (NMR sample tubes). The axes of these cylindrical vessels are necessarily displaced transversely to their axes by a separation interval of minimum magnitude D, where D is the outer diameter of the (identical) cylinders in tangential contact (for a minimum separation interval). This separation interval defines an axis x, orthogonal to the z axis (parallel with the tube axes) and intersecting the x axis at the mean of the separation interval. The z axis is precisely aligned to coincide with a z axis of the RF saddle coil of an NMR probe. Such saddle coils exhibit an x' axis, transverse to z, that defines the direction of an RF magnetic field associated with the saddle coil. These alignments and displacements are obtained in a sample holder assembly that further comprises an azimuthal reference that may take the form of a laterally projecting member providing an orientation reference for the x axis of the cylinder pair azimuthally in respect of a corresponding x' axis of the RF saddle coil, so as to align the x axis and x'.

Briefly stated, it is a goal of this work to realize a sample volume (particularly well suited to lossy samples) realized from inexpensive components. In the plane of the RF magnetic field of a saddle coil this sample vessel assembly presents a sample cross section that is elongate in a dimension aligned with the RF magnetic field of that saddle coil. The elongate geometry is realized by a plurality of cylindrical NMR sample tubes (at least a pair) arrayed to provide a cross section having major and minor axes in the plane of the cross section.

Another embodiment of the sample vessel assembly adds an auxiliary pair of cylindrical sample tubes on an auxiliary separation interval orthogonal to the separation interval of first sample tube pair. The auxiliary tubes are preferably of diameter less than D in order to allow a minimal magnitude for the auxiliary separation interval and thus to bring these auxiliary sample tubes to an acceptable minimum selected distance from the assembly axis/RF coil axis.

BRIEF DESCRIPTION OF THE DRAWINGS

FIG. 3b is a section A-A through a top portion of FIG. 3a.

FIG. 3c is a section through a bottom portion of the sample vessel assembly of FIG. 3a.

FIG. 4b is the noise determination for the spectrum of FIG. 4a.

DETAILED DESCRIPTION OF THE INVENTION

Figure 3B:
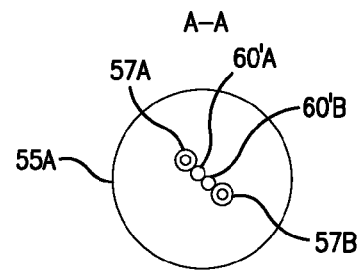
Figure 3C:
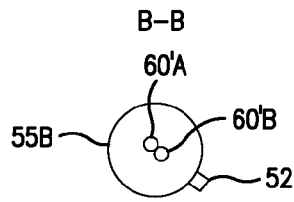
Figure 3A:
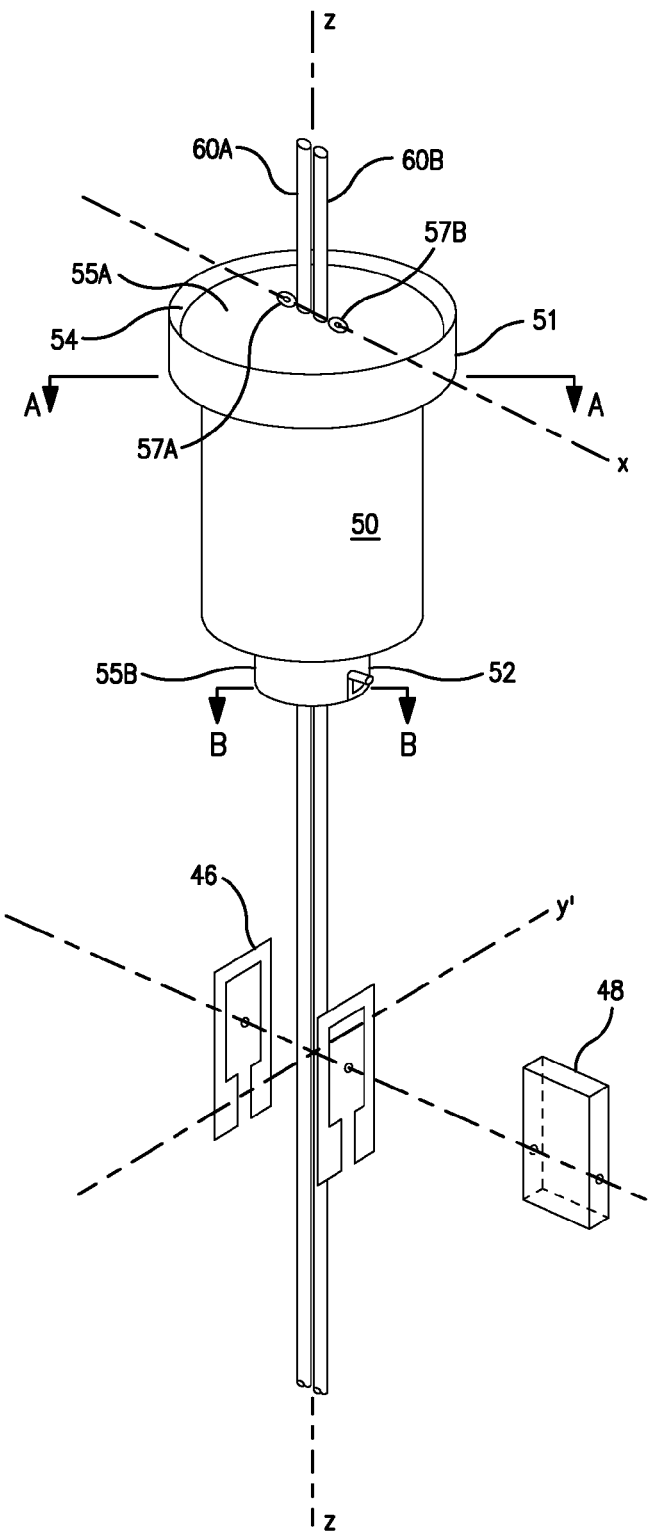
FIG. 3a is one form of sample vessel holder for implementing the sample cell of FIG. 2.

FIG. 3a shows a representative sample cell assembly for use with an NMR probe comprising a saddle coil 46 (here shown as one of the Alderman Grant variety) defining a sensitive volume 48 that is elongate in the plane transverse to the polarizing field. The sample cell assembly comprises a body 50 having an azimuthal reference 52 to obtain a selected azimuthal alignment of the body with respect to the saddle coil 46 of the NMR probe. Body 50 is characterized by axial geometry with body axis z coincident with the z axis of saddle coil 46. A cap portion 51 of the body 50 determines the axial relationship of body 50 with the sensitive volume 48 of the NMR probe, not otherwise illustrated. Each sample tube is maintained in the body 50 by frictional engagement with the outer surface of respective O-ring(s) 57A and 57B, which are in turn secured to the top alignment plate 55A through screws (not shown). The sample tubes are not otherwise constrained by passage through a bore through the interior of the body 50.

Figure 1B:
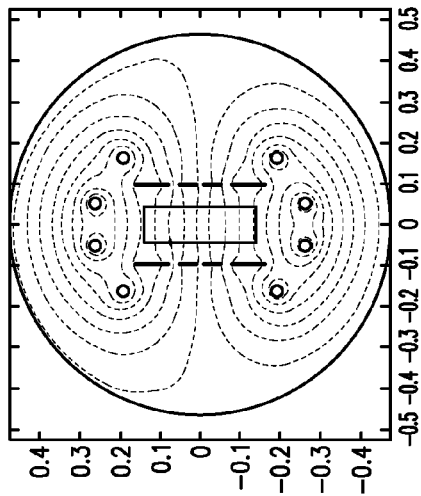
FIG. 1b is an improvement to FIG. 1a illustrating the field of the outer coil of a coaxial coil probe.
Figure 1C:
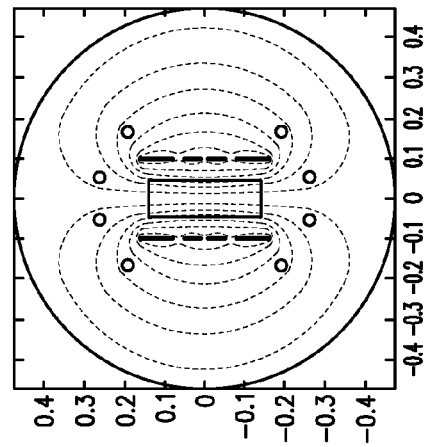
FIG. 1c shows the same as FIG. 1b with excitation from the inner coil.
Figure 1A:
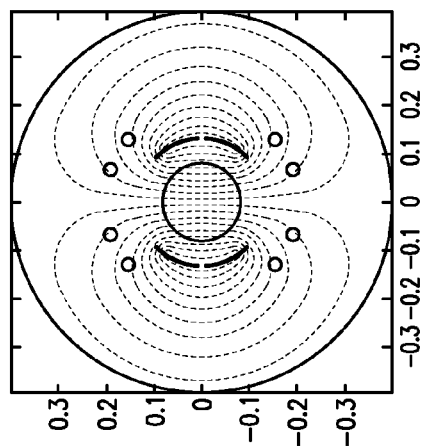
FIG. 1a is a schematic representation of a conventional NMR probe and sample vessel.
Figure 2:
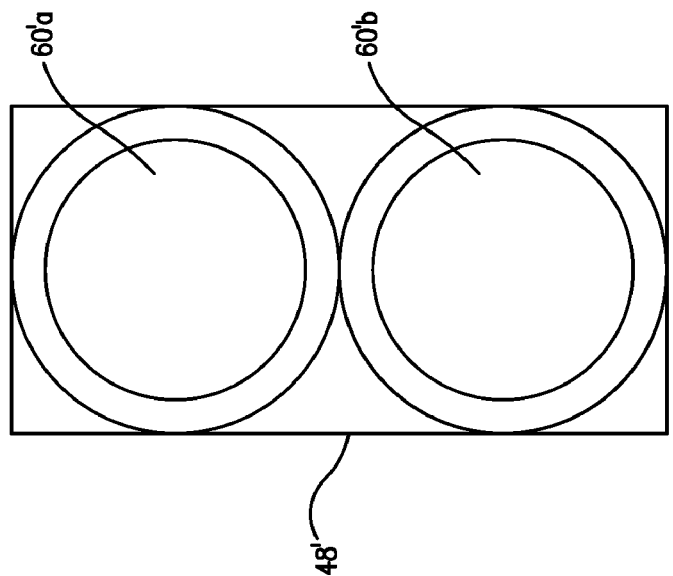
FIG. 2 shows the sample cell cross section of the present work.

The top planar surface of the body 50 conveniently comprises a recessed portion 54 for receiving a top alignment plate 55A, shown displaced from body 50 for clarity. The top alignment plate 55A is relatively unconstrained by recessed portion 54. As shown in FIG. 3b, NMR sample tubes 60A and 60B pass through apertures (also labeled 60A and 60B). In practice the apertures accommodating the tubes 60A and 60B may slightly overlap forming a dumbbell shape The opposite (bottom) planar end surface of the body 50 comprises a bore (not shown) for receiving a bottom alignment plate 55B in a close fit (approximately 0.001 inch tolerance). The alignment plates (so termed without reference to relative thickness) 55A and 55B support a pair of conventional NMR sample tubes 60A and 60B in mutual parallel alignment with the axis z, at a selected displacement of the axes of the respective sample tubes 60A and 60B. It should be clear that this displacement has a minimum value of D where D is the outer diameter of the sample tube. For the arrangement described, the two sample tubes provide a cross section of sample at the sensitive volume as shown in the example of FIG. 2. At FIG. 3a, the dotted lines portray the sensitive volume 48 corresponding to an interior portion of the cross section of the saddle coil 46, here shown as rectangular (not limited to such shape, but discussed here for experimental comparison below) and displaced for clarity. It should be understood that the "sensitive volume" is a term inclusive of tolerance for such degree of inhomogeneity of the field as may be theoretically appropriate or practically realizable. As shown in FIG. 2, the figure-8 shaped sample portion presents a section 48' through the sensitive volume 48. The sections 60'A and 60'B through the tubes 60A and 60B comprise the elongate dimension (e.g., x) of the section of the sensitive volume for the case of tangential contact of the tubes. The rectangular region shown in FIGS. 1B and 1C is a convenient reference for consideration of the sample volume cross section of this work and has been taken as a reference for experimental observation. A sample sectional area (neglecting sample tube wall thickness) of $2\pi(D/2)^2$ is shown inscribed in a hypothetical section of the exemplary rectangular area of D×2D. It is observed that the dual sample tubes yield a 78% approximation to the area (and hence volume) for sample in a hypothetical sensitive volume of identical maximum dimensions. For wall thickness t, one observes that the loss of sample cross section area attributed to wall thickness is, to first order, $2\pi(D/2)^2(4t/D)$.

The azimuthal reference 52 may be realized through a variety of means or through no "means" at all. There need only be established a known azimuthal relationship with the x axis (separation interval). In respect of engagement with the NMR probe, any appropriate means will suffice to establish alignment with the x' axis of the saddle coil. For example, the body of the NMR probe can be adapted to include a notch to accept an azimuthal reference for the holder in the form of a radially protruding pin from the body 50 or bottom alignment plate 55B. No such particular mechanical arrangement is required for this work: one of skill in the art recognizes that the holder may be re-oriented while observing the NMR resonance signal to obtain orientation at which the signal reaches maximum amplitude.

Alignment of the assembly proceeds through insertion of precisely machined tungsten rods through the top alignment plate 55A and through the bottom plate 55B and insertion of the body assembly into an appropriate jig establishing the coaxial relationship of body 50 and bottom plate 55B. The degree of freedom afforded by the top plate 55A in recessed portion 54 is then fixed by the jig. The dimension D for apertures (labeled 60A and 60B for convenience) incorporates an increment ε to accommodate diameter variation between different tubes which may be inserted into the assembly. For commercially available 3 mm tubes, $\epsilon$ is taken as $1 \times 10^{-3}$ inch.

After the sample holder assembly is assembled and alignment is procured the sample holder assembly is permanently secured and NMR sample tubes may be inserted and withdrawn as may be required.

Figure 4A:
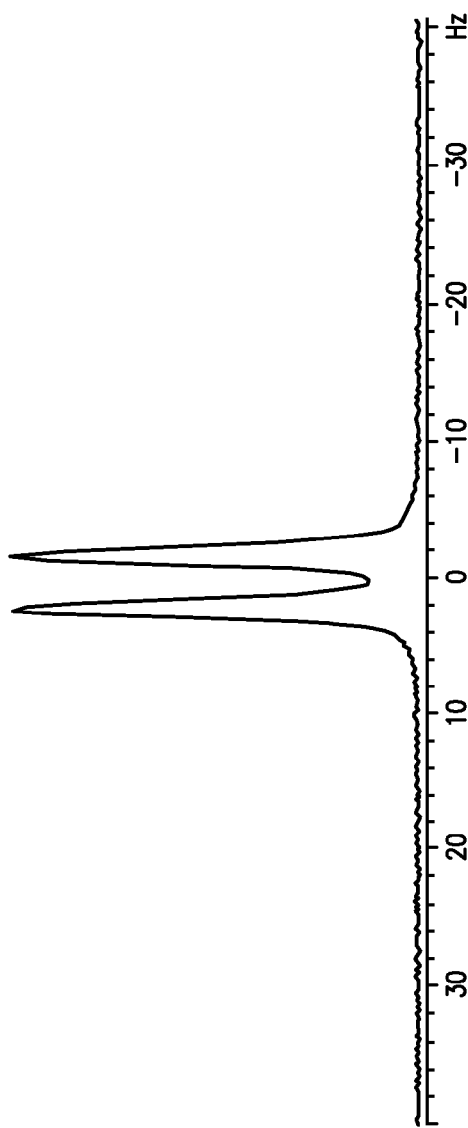
FIG. 4a is the anomeric proton portion of the sucrose spectrum for the present sample cell assembly.
Figure 4B:
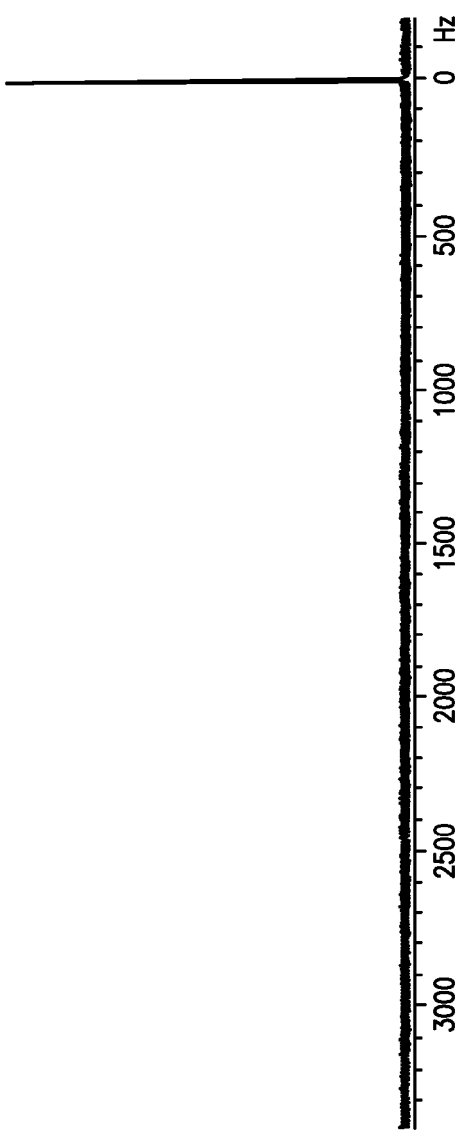

A sample cell assembly was constructed following FIGS. 2 and 3 for testing by comparison with a randomly selected rectangular cross section cell (FIGS. 1b and 1c). The cylindrical NMR sample tubes were of 3 mm O.D. in tangential contact, that is axis to axis displacement of 3 mm. The inner diameter of the sample tubes employed for this prototype was 2.4 mm. FIG. 4a is the spectral response of the anomeric proton of a sucrose sample (3.4 mg/ml in $D_2O$). Expansion of the spectral range for this spectrum (FIG. 4b) permits the measure of signal-to-noise over the range 200 Hz to 3200 Hz, yielding 188.5. The splitting of the anomeric proton resonance is exhibits a depth of 89% of the resonant peak. The half-height width of the lower split peak is 1.5 Hz.

Figure 4C:
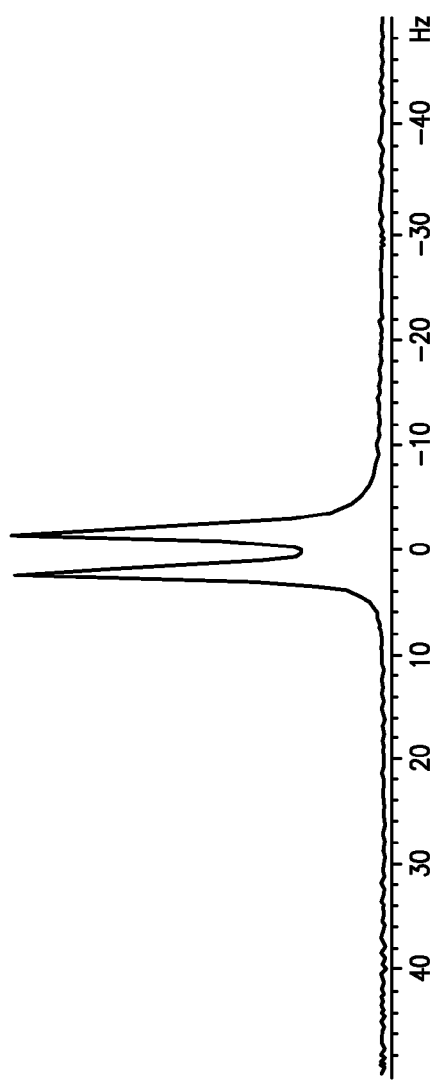
FIG. 4c is the anomeric proton portion of the sucrose spectrum for the prior art sample cell.
Figure 4D:
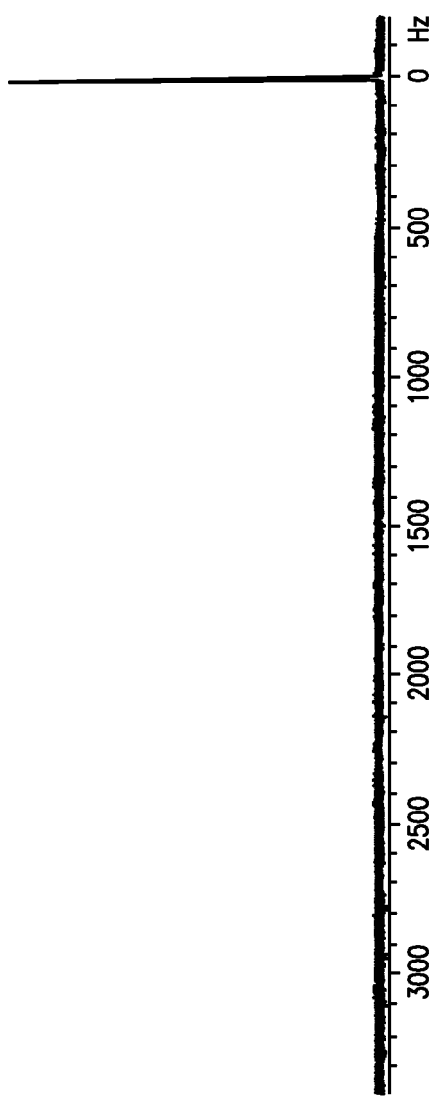
FIG. 4d is the noise determination for the data of FIG. 4c.

Using the same probe, the same sample solution was presented for analysis in a sample cell of rectangular cross section having nominal outer cross sectional dimensions of 6 mm. by 3 mm. and inner cross sectional area of 10.6 $mm^2$. This reference rectangular (parallelipiped) cell was selected from a number of nominally identical cells by comparison of NMR spectral response of these cells. The corresponding results are shown in FIGS. 4c and 4d. The signal-to-noise parameter obtained is 188.3, essentially identical with the present work, but the depth of the split is found to be 78% of the resonance amplitude and the width at half amplitude for the lower peak is 1.66 Hz. Offering an actual sample volume 17% greater than the two tube sample of FIG. 4a, it is unexpected that a such significantly lower resolution results for the same signal-to-noise figure.

The difference in resolution for the same signal-to-noise figure is unexpected. The difference is attributed to dimensional irregularities of the prior art cell of rectangular cross section in comparison with the decidedly precise and reproducible characteristics of unselected cylindrical NMR sample tubes. It is important to recognize that a rectangular prism sample cell meeting the specifications of uniformity prescribed for a pair of cylindrical NMR sample tubes would have a cost ratio that can only be estimated as orders of magnitude.

It is noteworthy that the present work yields a filling factor significantly less than the rectangular, reference example. It is therefore quite unexpected that the same signal-to-noise ration is achieved with less sample and with an apparently non-optimum geometry. In this comparison, the prior art reference cell enjoyed a volume advantage factor of 1.17 over the sample volume for the dual tube composite cell of this work. Special thin wall NMR sample tubes, commercially available (from Wilmad Ltd., Buena, N.J.) would increase the inner diameter to 2.6 mm, providing additional volume (increased filling factor) with an attendant expected further increase in signal-to-noise parameter for the present work.

In the abstract sense, one might hypothesize an elongate array of NMR sample tubes geometrically limiting the sample to the desired region and capable of precise alignment with the RF magnetic field of the saddle coil. Practical considerations introduce limits on the volume given over to the material of the individual sample vessels at the expense of sample. Dimensional constraints are introduced by the NMR magnet bore and in consequence thereof, the space available for the NMR probe. It is with those considerations and the excellent specifications of commercially available NMR tubes, that two 3 mm NMR tubes are preferred in the assembly here described.

Figure 5:
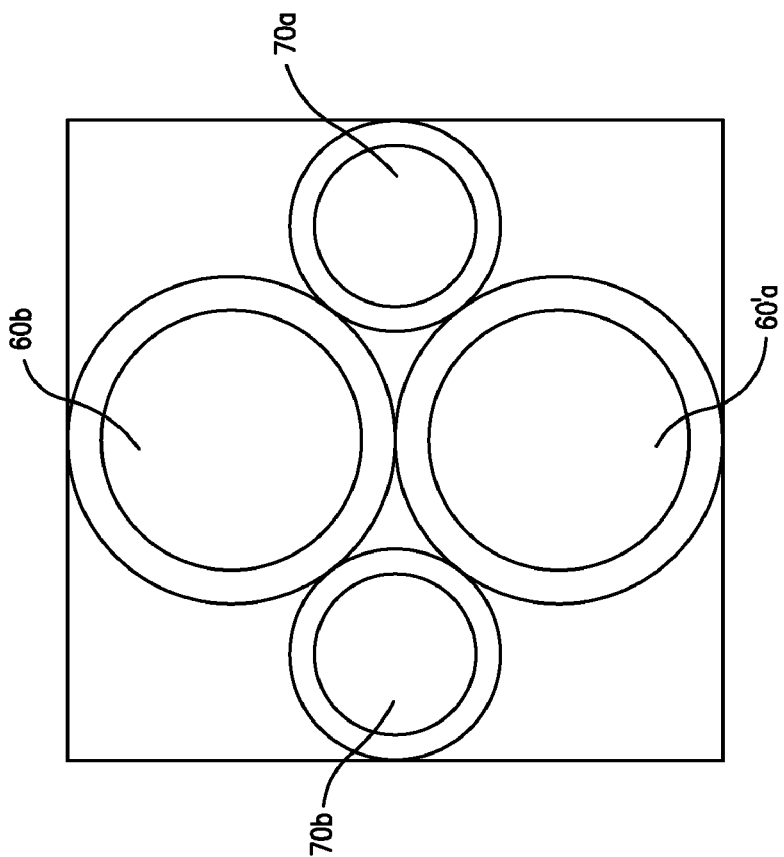
FIG. 5 is an alternative embodiment of this work.

In another embodiment as shown in FIG. 5, an auxiliary pair of NMR sample tubes 70A and 70B are added to the assembly in mutual inter-axial displacement orthogonal to the inter-axial displacement of the axes of first sample tube pair 60A and 60B. The auxiliary pair of tubes are preferably of significantly smaller outer diameter to permit selection closer proximity to the central axis of the NMR coil. More precisely, the spatial separation between auxiliary tubes 70A and 70B must not be substantially equal to the separation interval for sample tubes 60A and 60B, because that would remove the elongate character here required. The auxiliary pair allow use of a chemical shift reference sample or other non-miscible reference, or any other sample. In one example, a low loss lock solvent might be employed. In the example shown the auxiliary pair 70A and 70B consist of 1.7 mm O.D. NMR tubes allowing about 44% of the volume of the (primary) tube pair. The user might then avoid dilution of the primary sample with labile deuterons in a deuterated solution at a slightly greater displacement from the NMR probe axis. It is observed that the auxiliary pair of tubes 70A and 70B may take on a diameter significantly greater than the more centrally disposed pair, thus establishing an elongate axis in the plane of the sample cross section. This creates a larger sample volume more distant from the RF coil axis and a smaller volume proximate that axis. Such arrangement would not be preferred for a lossy sample.

While this work has been described with reference to specific embodiments, the description is illustrative of the work and is not to be construed as limiting the scope of the work. Various modifications and changes may occur to those skilled in the art without departing from the true spirit and scope of the innovation as defined by the appended claims.

What is claimed is:

1. An NMR sample holder assembly for use with an RF saddle coil of an NMR probe, said saddle coil defining an RF magnetic axis, said sample holder assembly adapted to accept at least a pair of cylindrical NMR sample tubes each of the sample tubes of diameter D, the sample holder comprising:

an axially symmetric body and a first planar end surface transverse to an axis of said body, said body comprising a bore of diameter greater than 2D, said bore coaxial with the body axis, said NMR sample holder assembly adapted to engage with said NMR probe in selected relative azimuthal orientation therebetween;

a top alignment plate comprising at least a pair of apertures and said top alignment plate disposed in a recess in said top planar end surface, said pair of apertures displaced by a selected spatial interval, said spatial interval defining a first transverse axis, said first transverse axis azimuthally aligned at a selected angle to the RF magnetic axis of said RF saddle coil; and a bottom alignment plate comprising at least a pair of apertures and said bottom alignment plate disposed in a recess in a bottom planar surface parallel with said first planar end surface, said pair of apertures displaced by said selected spatial interval, said spatial interval defining a bottom transverse axis, said first transverse axis and said bottom transverse axis being in mutual alignment;

said apertures for accepting and supporting at least a pair of cylindrical sample tubes, each said tube comprising an axis of symmetry and said symmetry axes in precise mutual alignment.

2. The NMR sample assembly of claim 1, further comprising a first pair of said cylindrical tubes, said tubes each of diameter D, said axes of said tubes displaced by a separation interval, whereby said pair of tubes define a transverse cross section comprising a pair of circular regions and the extreme dimensions of said pair of circular regions are 2D by D.

3. The NMR sample holder assembly of claim 1 wherein said separation interval is D, whereby said pair of apertures are in closest proximity to the axis of said saddle RF coil.

4. The NMR sample holder assembly of claim 1, wherein said top and bottom alignment plates each further comprises a pair of auxiliary apertures, said auxiliary apertures symmetrically displaced about said body axis and having a mutual displacement defining an auxiliary transverse axis orthogonal to said first transverse axis on each said top and bottom alignment plates.

5. A method of presenting a selected liquid sample for NMR analysis comprising the steps of:
   inserting a pair of identical cylindrical NMR sample tubes, each containing the selected sample into an NMR sample holder assembly, each said sample tube comprising a cylindrical axis and having outer diameter D, said pair of sample tubes in mutually paraxial orientation at mutual displacement of at least D between said symmetry axes of said tubes and defining a line of at least 2D comprising an outer transverse dimension for said pair of tubes;
   axially disposing said NMR sample holder assembly into an NMR probe comprising an RF saddle coil having an axis of symmetry and comprising a first RF magnetic field direction directed transverse to said axis of symmetry, said axial disposition placing said cylindrical axes of said tubes symmetrically about, and in parallel relationship to said axis of symmetry of the RF saddle coil, and
   azimuthally orienting said transverse dimension of length 2D to coincide with the direction of said RF magnetic field, whereby said pair of cylindrical sample tubes present an elongate cross sectional shape to a plane containing said RF magnetic field.

6. The method of claim 5, wherein said step of orienting comprises engaging a radial protrusion from said sample holder assembly and said protrusion aligned in relation with said line of at least 2D, with a notch in said NMR sample probe aligned in relation with said first RF magnetic field direction.

7. The method of claim 5, wherein said step of orienting comprises
   a) observing the strength of an NMR resonant signal from said selected sample for a selected azimuthal orientation of said line of at least 2D;
   b) rotating the NMR sample holder assembly by a selected increment and repeating step a); and
   c) locating that orientation for which maximum NMR resonant signal is observed whereby that orientation is selected completes the step of orienting.

8. An NMR probe comprising:
   an RF saddle coil comprising an axis defining an RF magnetic field and a geometric axis of symmetry, said saddle coil mounted within a probe body; and
   a sample holder assembly for introducing at least a pair of cylindrical NMR sample tubes each comprising diameter D to an interior space of said saddle coil and disposing the axes of the pair of tubes symmetrically parallel with the geometric axis of the saddle coil, said sample holder comprising:
   an axially symmetric body and a top planar end surface transverse to an axis of said body, said body comprising a bore of diameter greater than 2D, said bore coaxial with the body axis, said NMR sample holder assembly adapted to align with said RF saddle coil in selected relative azimuthal orientation therebetween,
   a top alignment plate comprising at least a pair of apertures each aperture surrounding one said cylindrical NMR sample tube, and said top alignment plate disposed in a recess in said first planar end surface, said pair of apertures comprising corresponding centers displaced by a selected spatial interval and comprising a pair of circular regions, the extreme dimensions of said pair of circular regions being D by at least 2D, said spatial interval of length at least 2D defining a first transverse axis, said first transverse axis azimuthally aligned with the RF magnetic axis of said RF saddle coil, and
   a bottom alignment plate comprising at least a pair of apertures in correspondence with the apertures in said top alignment plate, and said bottom alignment plate disposed in a bore through a bottom planar end surface of said body, said bottom planar surface parallel with said first planar end surface, said pair of apertures displaced by said selected spatial interval, said spatial interval defining a bottom transverse axis, said first transverse axis and said bottom transverse axis in mutual alignment,
   said apertures for accepting and supporting said pair of cylindrical sample tubes in precise mutual alignment.

9. The NMR probe of claim 8, wherein said sample holder assembly comprises an azimuthal reference and said probe body comprising an azimuthal reference acceptor for cooperating with the azimuthal reference of the probe body, whereby said selected relative azimuthal orientation of the RF saddle coil with the holder assembly is accomplished.

10. The NMR probe of claim 9, wherein said region of extreme dimensions D by 2D is so aligned to orient the at least 2D dimension parallel with the RF magnetic field.

* * * * *